United States Patent
Lius et al.

(10) Patent No.: US 10,559,596 B2
(45) Date of Patent: Feb. 11, 2020

(54) DISPLAY DEVICE

(71) Applicant: InnoLux Corporation, Miao-Li County (TW)

(72) Inventors: Chandra Lius, Miao-Li County (TW); Kuan-Feng Lee, Miao-Li County (TW)

(73) Assignee: INNOLUX CORPORATION, Chu-Nan, Miao-Li County (TW)

( * ) Notice: Subject to any disclaimer, the term of this patent is extended or adjusted under 35 U.S.C. 154(b) by 0 days.

(21) Appl. No.: 15/934,678

(22) Filed: Mar. 23, 2018

(65) Prior Publication Data
US 2019/0296055 A1 Sep. 26, 2019

(51) Int. Cl.
| | | |
|---|---|---|
| *H01L 29/04* | (2006.01) | |
| *H01L 27/12* | (2006.01) | |
| *G02F 1/1335* | (2006.01) | |
| *G02F 1/1368* | (2006.01) | |

(52) U.S. Cl.
CPC ........ *H01L 27/1214* (2013.01); *G02F 1/1368* (2013.01); *G02F 1/133512* (2013.01); *G02F 1/133553* (2013.01); *G02F 2201/121* (2013.01); *G02F 2201/123* (2013.01)

(58) Field of Classification Search
CPC ............................ G02F 1/1368; H01L 27/1214
USPC .......................................................... 257/59
See application file for complete search history.

(56) References Cited

U.S. PATENT DOCUMENTS

| | | | | |
|---|---|---|---|---|
| 2003/0094615 | A1* | 5/2003 | Yamazaki | ............... H01L 27/12 257/72 |
| 2006/0261253 | A1* | 11/2006 | Arao | ......................... G01J 1/18 250/214.1 |
| 2011/0227878 | A1* | 9/2011 | Makita | .................... H01L 27/12 345/175 |
| 2017/0161540 | A1 | 6/2017 | Mienko et al. | |
| 2017/0161543 | A1* | 6/2017 | Smith | .................. G06K 9/0008 |
| 2017/0220844 | A1 | 8/2017 | Jones et al. | |

FOREIGN PATENT DOCUMENTS

JP 2008020305 A * 1/2008

* cited by examiner

*Primary Examiner* — Ajay Arora
(74) *Attorney, Agent, or Firm* — Muncy, Geissler, Olds & Lowe, P.C.

(57) ABSTRACT

A display device is disclosed, which includes: a substrate; a first metal layer, disposed on the substrate and having a first pinhole; a second metal layer, disposed on the first metal layer and having a second pinhole; a pixel electrode layer, disposed on the second metal layer; and a light detecting element for detecting a light passing through the second pinhole and the first pinhole.

18 Claims, 10 Drawing Sheets

DISPLAY DEVICE

BACKGROUND

1. Field

The present disclosure relates to a display device, and more particularly to a display device integrated with a light detecting element.

2. Description of Related Art

Nowadays, the display devices are required to have not only the display function but also other functions such as touch or identification functions. In addition, for a purpose that the display devices have ultra narrow border (higher display-to-body ratio), sensors have to be embedded into display region of the display devices. Hence, how to integrate a sensor into the display region without reducing the accuracy or the resolution but keep the display performance of the display device is an issue.

SUMMARY

The object of the present disclosure is to provide a display device integrated with a light detecting element.

One aspect of the present disclosure provides a display device which comprises: a substrate; a first metal layer, disposed on the substrate and having a first pinhole; a second metal layer, disposed on the first metal layer and having a second pinhole; a pixel electrode layer, disposed on the second metal layer; and a light detecting element for detecting a light passing through the second pinhole and the first pinhole.

Another aspect of the present disclosure provides a display device which comprises: a substrate; a second metal layer, disposed on the substrate and having a second pinhole; a pixel electrode layer, disposed on the second metal layer; and a light detecting element for detecting a light passing through the second pinhole.

Other novel features of the disclosure will become more apparent from the following detailed description when taken in conjunction with the accompanying drawings.

DETAILED DESCRIPTION OF EMBODIMENT

The following embodiments when read with the accompanying drawings are made to clearly exhibit the above-mentioned and other technical contents, features and/or effects of the present disclosure. Through the exposition by means of the specific embodiments, people would further understand the technical means and effects the present disclosure adopts to achieve the above-indicated objectives. Moreover, as the contents disclosed herein should be readily understood and can be implemented by a person skilled in the art, all equivalent changes or modifications which do not depart from the concept of the present disclosure should be encompassed by the appended claims.

Furthermore, the ordinals recited in the specification and the claims such as "first", "second" and so on are intended only to describe the elements claimed and imply or represent neither that the claimed elements have any proceeding ordinals, nor that sequence between one claimed element and another claimed element or between steps of a manufacturing method. The use of these ordinals is merely to differentiate one claimed element having a certain designation from another claimed element having the same designation.

Furthermore, the ordinals recited in the specification and the claims such as "above", "over", or "on" are intended not only directly contact with the other element, but also intended indirectly contact with the other element. Similarly, the ordinals recited in the specification and the claims such as "below", or "under" are intended not only directly contact with the other element but also intended indirectly contact with the other element.

In addition, the features in different embodiments of the present disclosure can be mixed to form another embodiment.

Embodiment 1

Figure 1:
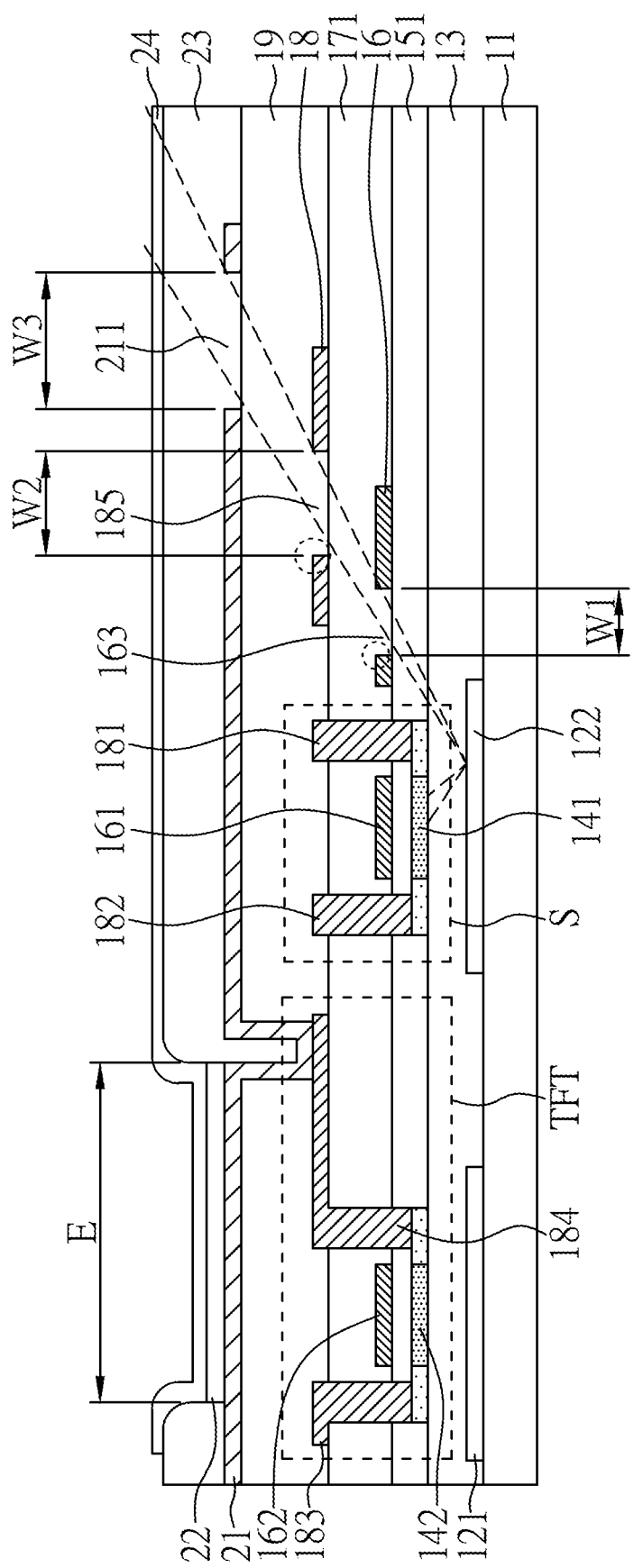
FIG. 1 is a cross sectional view of a display device according to Embodiment 1 of the present disclosure.

FIG. 1 is a cross sectional view of a display device of the present embodiment. A substrate 11 is provided, which can be a quartz substrate, a glass substrate, a plastic substrate, a metal foil substrate, a composite substrate of plastic and metal, or other inflexible or flexible substrates. A light shielding layer 121 and a reflective layer 122 is disposed on the substrate 11, and the light shielding layer 121 and the reflective layer 122 may respectively comprise metal (for example, Ag, Al, Ti, Cr, or Mo, but the present disclosure is not limited thereto) or alloy formed as a single layer structure or a multilayer structure by the same process in the embodiment. In other embodiment, at least one of the light shielding layer 121 and the reflective layer 122 may comprises black resin, or multi transparent insulation layers with different refraction indexes. A buffer layer 13 is disposed on the light shielding layer 121 and the reflective layer 122, and the buffer layer 13 may comprise silicon oxide, silicon oxynitride, silicon nitride, aluminum oxide, resin, polymer, photoresist, or a combination thereof.

A first semiconductor portion 141 and a second semiconductor portion 142 are respectively disposed on the buffer layer 13, and the first semiconductor portion 141 and the second semiconductor portion 142 may comprise amorphous silicon, low temperature poly-silicon, or Indium Gallium Zinc Oxide (IGZO). Next, a first gate insulating layer 151 is disposed on the first semiconductor portion 141 and the second semiconductor portion 142, and the first gate insulating layer 151 may comprise silicon oxide, silicon oxynitride, silicon nitride, aluminum oxide, resin, polymer, photoresist, or a combination thereof. Then, a first metal layer 16 is disposed on the first gate insulating layer 151, wherein the first metal layer 16 comprises a first gate electrode 161 corresponding to the first semiconductor portion 141 and a second gate electrode 162 corresponding to the second semiconductor portion 142, and the first metal layer 16 further comprises a first pinhole 163. The first pinhole 163 is an enclosed opening disposed within a pattern of the first metal layer 16, and the pattern may be or may not be connected with the first gate electrode 161 or the second gate electrode 162. A first insulating layer 171 is disposed on the first metal layer 16. A second metal layer 18 is disposed on the first insulating layer 171, wherein the second metal layer 18 comprises a first source electrode 181, a first drain electrode 182, a second source electrode 183 and a second drain electrode 184, and the second metal layer 18 further comprises a second pinhole 185. The second pinhole 185 is an enclosed opening disposed within a pattern of the second metal layer 18, and the pattern may be or may not be connected with the first source electrode 181, the first drain electrode 182, the second source electrode 183, or the second drain electrode 184. Herein, the first metal layer 16 and the second metal layer 18 may comprise Cu, Al, Ti, Cr, Mo, an alloy thereof, or a combination thereof, or other electrode materials. The first insulating layer 171 may comprise silicon oxide, silicon oxynitride, silicon nitride, aluminum oxide, resin, polymer, photoresist, or a combination thereof, but the present disclosure is not limited thereto. Hence, a light detecting element S is formed, which comprises: the first semiconductor portion 141; the first gate electrode 161 corresponding to the first semiconductor portion 141; and the first source electrode 181 and the first drain electrode 182 respectively electrically connected to the first semiconductor portion 141. In addition, a driving element TFT is also formed, which comprises: the second semiconductor portion 142; the second gate electrode 162 corresponding to the second semiconductor portion 142; and the second source electrode 183 and the second drain electrode 184 respectively electrically connected to the second semiconductor portion 142. The driving element TFT may directly or indirectly electrically connected to the light detecting element S.

Herein, both the light detecting element S and the driving element TFT are transistors with a top gate structure; but the present disclosure is not limited thereto, and a transistor with a bottom gate structure may also be used as one of or both the light detecting element S and the driving element TFT. In addition, the driving element TFT used herein is an amorphous silicon transistor or a low-temperature polysilicon (LTPS) transistor; but the present disclosure is not limited thereto, and an oxide semiconductor transistor (such as IGZO transistor) may also be used as the driving element TFT. Furthermore, the light detecting element S used herein is a transistor; but the present disclosure is not limited thereto, and other type of light detecting element (for example, a photodiode) can also be used as the light detecting element S, as long as the purpose of signal sensing can be achieved.

A passivation layer 19 is disposed on the second metal layer 18, and the passivation layer 19 may comprise silicon oxide, silicon oxynitride, silicon nitride, aluminum oxide, resin, polymer, photoresist, or a combination thereof. A first pixel electrode layer 21 is disposed on the passivation layer 19 and electrically connected to the driving element TFT. A pixel defining layer 23 is disposed on the first pixel electrode layer 21 and has an opening to expose the first pixel electrode layer 21 to define a light emitting region E (a display unit). The pixel defining layer 23 may comprise silicon oxide, silicon oxynitride, silicon nitride, aluminum oxide, resin, polymer, photoresist, or a combination thereof, but the present disclosure is not limited thereto. A light emitting layer 22 is disposed in the opening of the pixel defining layer 23, and a part of the light emitting layer 22 may be disposed between the pixel defining layer 23 and the first pixel electrode layer 21 or a part of the light emitting layer 22 may be disposed on the sidewall of the opening of the pixel defining layer 23. The light emitting layer 22 may comprise organic light emitting material, inorganic light emitting material, or quantum dots material. A second pixel electrode layer 24 is disposed on the pixel defining layer 23 and in contact with the light emitting layer 22. The light emitting layer 22 is disposed between the first pixel electrode layer 21 and the second pixel electrode layer 24. Hence, the display device of the present disclosure is obtained, which is a self emitting type organic light emitting diode (OLED) display device. In other embodiment, the display device may be a self-emitting type inorganic light emitting diode (LED) display device, or a self-emitting type quantum dot light emitting diode (QLED) display device. Herein, the first pixel electrode layer 21 may comprise Ag, Al, Al, Ti, Cr, Mo, an alloy thereof, or a combination thereof, or other material with high reflective properties; and the second pixel electrode layer 24 may mainly comprise transparent conductive metal oxide such as ITO, IZO, ITZO, IGZO, or AZO. In some embodiments of the present disclosure, the second pixel electrode layer 24 may comprise Ag, Al, Al, Ti, Cr, Mo, an alloy thereof, or a combination thereof for reducing resistance, but not substantially interfering with the display performance of the display device. The second pixel electrode layer 24 is primarily transparent in the present disclosure. However, the present disclosure is not limited thereto.

As shown in FIG. 1, the display device of the present embodiment comprises: a substrate 11; a first metal layer 16, disposed on the substrate 11 and having a first pinhole 163; a second metal layer 18, disposed on the first metal layer 16 and having a second pinhole 185; a first pixel electrode layer 21, disposed on the second metal layer 18; a second pixel electrode layer 24, disposed on the first pixel electrode layer 21; and a light detecting element S for detecting a light passing through at least the second pinhole 185 and the first pinhole 163. The light may pass through or may not pass through the first pixel electrode layer 21 or the second pixel electrode 24 depending on layout design.

Herein, the first pinhole 163 of the first metal layer 16 and the second pinhole 185 of the second metal layer 18 can create a light path. When providing an informative photo signal (for example, visible light, near IR or IR light signal), the provided photo signal can pass through the light path created by the first pinhole 163 and the second pinhole 185 and reach to the light detecting element S. Because the first pinhole 163 and the second pinhole 185 can guide light to the light detecting element S embedded in the display device, the accuracy or resolution of the light detecting element S can further be improved. In addition, because the light detecting element S is embedded into the display region of the display device, the display-to-body ratio can also be improved, and the border of the display device could be further reduced.

In the present embodiment, because the first pixel electrode layer 21 is a reflective electrode, the first pixel electrode layer 21 has a third pinhole 211. Hence, the third pinhole 211 together with the first pinhole 163 and the second pinhole 185 create the light path, so the light can pass through the third pinhole 211, the second pinhole 185 and the first pinhole 163 and can be detected by the light detecting element S.

In another embodiment of the present disclosure, the second pixel electrode layer 24 may selectively comprise a fourth pinhole (not shown in the figure), thus the fourth pinhole together with the first pinhole 163, the second pinhole 185 and the third pinhole 211 create the light path.

However, in other embodiment of the present disclosure, if the display device is a bottom emission type, the first pixel electrode layer 21 can be a transparent electrode as illustrated before, and the first pixel electrode layer 21 does not have to comprise the third pinhole.

In the present embodiment, the first pinhole 163, the second pinhole 185 and the third pinhole 211 are an enclosed hole, in which a sidewall of the enclosed hole is continuous. In addition, the first pinhole 163 has a first width W1, the second pinhole 185 has a second width W2, and the first width W1 and the second width W2 are different. The third pinhole 211 has a third width W3, and the third width W3 is also different from the first width W1 and the second width W2. Herein, the first width W1, the second width W2 and the third width W3 respectively refer to the average width (average of maximum width of a pinhole plus minimum width of the pinhole) or diameter of the first pinhole 163, the second pinhole 185 and the third pinhole 211. The relation between the first width W1, the second width W2 and the third width W3 are not particularly limited. In the present embodiment, the widths are gradually increased from the first width W1, the second width W2 to the third width W3 (W1<W2<W3). In another embodiment of the present disclosure, the widths can be gradually reduced from the first width W1, the second width W2 to the third width W3 (W1>W2>W3). In another embodiment of the present disclosure, the second width can be greater than the first width W1 or the third width W3 (W2>W1, or W2>W3). In further another embodiment of the present disclosure, the widths of two or three of the first width W1, the second width W2 and the third width W3 can be the same (W1=W2≠W3, W2=W3≠W1, W3=W1≠W2, or W1=W2=W3).

In the present embodiment, the light detecting element S is formed by the first metal layer 16 and the second metal layer 18. In detail, the first metal layer 16 comprises a first gate electrode 161, the second metal layer 18 comprises a first source electrode 181 and a first drain electrode 182, and the light detecting element S comprises the first gate electrode 161, the first source electrode 181 and the first drain electrode 182.

In the present embodiment, the light detecting element S is disposed on the substrate 11, and the display device further comprises a reflective layer 122 disposed between the substrate 11 and the light detecting element S. Since the light is laterally injected into the display device and is not injected into the light detecting element S in a normal direction of the display device, the reflective layer 122 can reflect the light to the light detecting element S after the light passes through the third pinhole 211, the second pinhole 185 and the first pinhole 163 to the reflective layer 122.

Figure 2B:
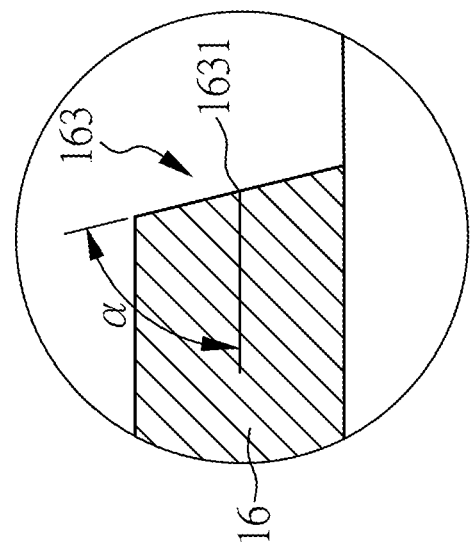
FIG. 2B is a perspective view showing a region of a first metal layer close to a first pinhole.
Figure 2A:
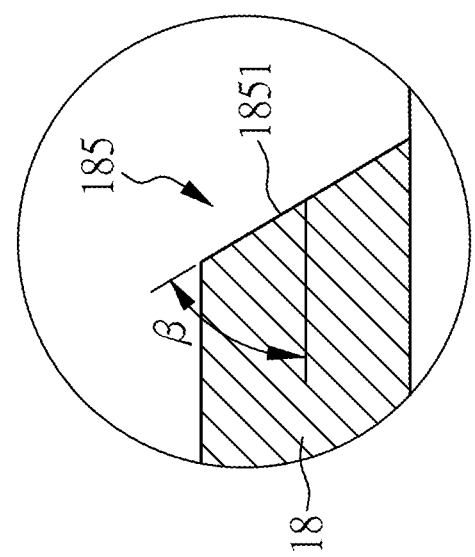
FIG. 2A is a perspective view showing a region of a second metal layer close to a second pinhole.

FIG. 2A is an enlarged view of a region of a second metal layer close to a second pinhole shown in FIG. 1, and FIG. 2B is an enlarged view of a region of a first metal layer close to a first pinhole shown in FIG. 1. In the present embodiment, a first edge 1631 of the first pinhole 163 has a first slope α, and a second edge 1851 of the second pinhole 185 has a second slope β. The first slope α is measured at 50% thickness of the first metal layer 16, and the second slope β is measured at 50% thickness of the second metal layer 18. In one embodiment of the present disclosure, the first slope α and the second slope β are different if the materials for the first metal layer 16 and the second metal layer 18 are different or the thickness of the first metal layer 16 and the second metal layer 18 are different. In another embodiment of the present disclosure, the first slope α and the second slope β are identical if the materials and the thicknesses for the first metal layer 16 and the second metal layer 18 are the same. Herein, the first slope α and the second slope β can respectively be less than 90°.

In the present embodiment, one light detecting element is disposed in and corresponding to one subpixel region. However, the present disclosure is not limited thereto. In another embodiment of the present disclosure, one light detecting element S is disposed in and corresponding to a region including plural subpixel regions. In addition, plural light detecting elements can be disposed in more than one part of the display region or in the whole display region of the display device, and the plural light detecting elements can be disposed randomly or evenly in the display region of the display device.

Embodiment 2

Figure 3:
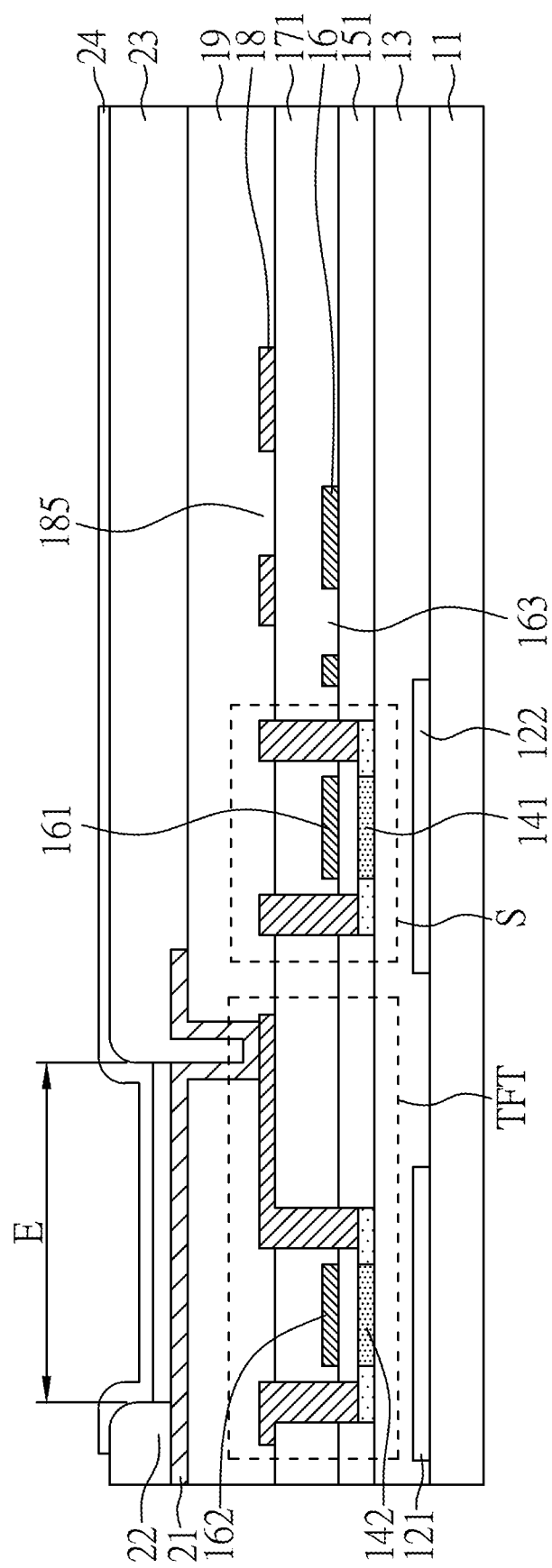
FIG. 3 is a cross sectional view of a display device according to Embodiment 2 of the present disclosure.

FIG. 3 is a cross sectional view of a display device of the present embodiment. The display device of the present embodiment is similar to that of Embodiment 1, except for the following.

In the present embodiment, the first pixel electrode layer 21 does not extend and overlap the first pinhole 163 and the second pinhole 185, and the first pixel electrode layer 21 dose not comprises a third pinhole 211 (as shown in FIG. 1).

Embodiment 3

Figure 4:
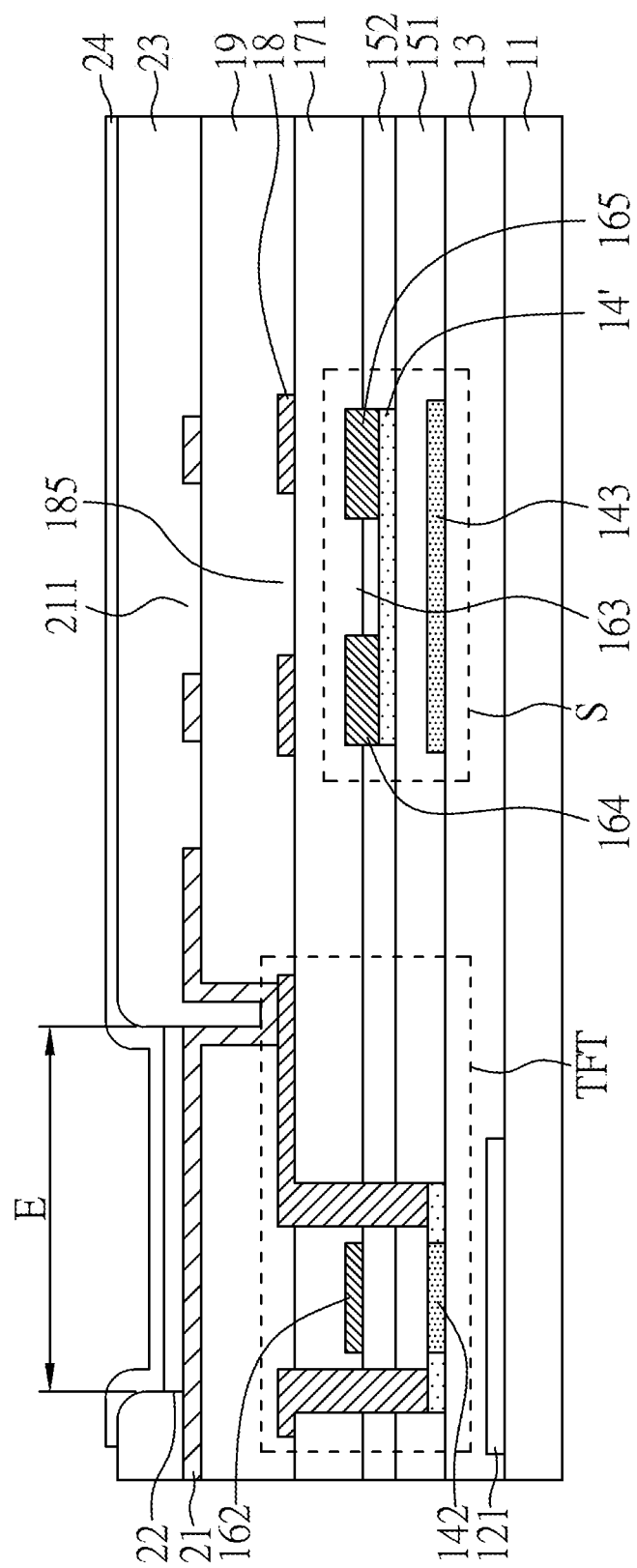
FIG. 4 is a cross sectional view of a display device according to Embodiment 3 of the present disclosure.

FIG. 4 is a cross sectional view of a display device of the present embodiment. The display device of the present embodiment is similar to that of Embodiment 1, except for the following.

In the present embodiment, the light detecting element S is a transistor with a bottom gate structure. Herein, a doped semiconductor region 143 with improved conductivity is used as a gate electrode of the light detecting element S, the doped semiconductor region 143 may use the same material with the second semiconductor portion 142 but with additional impurity doped within it. The doped semiconductor region 143 and the second semiconductor portion 142 may comprise amorphous silicon, poly-silicon, or IGZO, but the present disclosure is not limited thereto. The gate electrode of the light detecting element S can be formed by metal (Cu, Al, Ti, Cr, Mo, an alloy thereof, or a combination thereof), transparent conductive metal oxide (ITO, IZO, ITZO, IGZO, or AZO), or other kind of doped semiconductor material (amorphous silicon, poly-silicon, or IGZO). After forming the first gate insulating layer 151 on the doped semiconductor region 143 and the second semiconductor portion 142, a first semiconductor region 14' formed by another semiconductor layer is disposed on the first gate insulating layer 151. The first semiconductor region 14' may comprise amorphous silicon, poly-silicon, or IGZO. A second gate insulating layer 152 is disposed on the first semiconductor region 14', and the material for the second gate insulating layer 152 can be similar to that of the first gate insulating layer 151 and is not repeated again. The first metal layer comprising a second gate electrode 162, a first source electrode 164 and a first drain electrode 165 are disposed on the second gate insulating layer 152 to obtain the light detecting element S.

Herein, the first metal layer comprises a first source electrode 164 and a first drain electrode 165, the light detecting element comprises the first source electrode 164 and the first drain electrode 165, and the first pinhole 163 is a space formed between the first source electrode 164 and the first drain electrode 165 in top view.

In addition, the first pinhole 163, the second pinhole 185 and the third pinhole 211 are vertically aligned to form a light path, which means the first pinhole 163, the second pinhole 185 and the third pinhole 211 overlaps the light detecting element S in a normal direction of the display device. Hence, the photo signal can directly reach to the light detecting element S and the display device of the present disclosure does not have to equip with the reflective layer 122.

Embodiment 4

Figure 5:
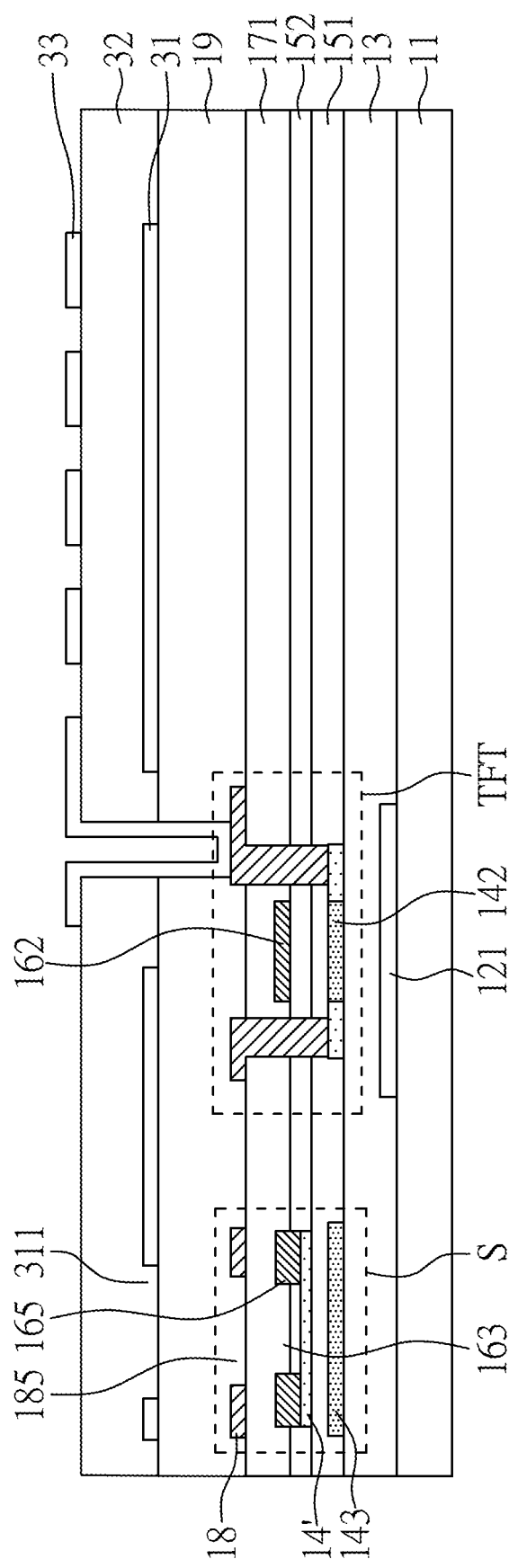
FIG. 5 is a cross sectional view of a display device according to Embodiment 4 of the present disclosure.

FIG. 5 is a cross sectional view of a display device of the present embodiment. The display device of the present embodiment is similar to that of Embodiment 3, except for the following.

In the present embodiment, a first electrode layer 31 is formed on the passivation layer 19 and electrically connected to the driving element TFT, an insulating layer 32 is formed on the first electrode layer 31, and then a second electrode layer 33 is formed on the insulating layer 32. Herein, the first electrode layer 31 and the second electrode layer 33 can respectively be a transparent electrode illustrated before. The material for the insulating layer 32 can be the same as that for the first insulating layer 171, and is not repeated again.

The display device of the present disclosure is a liquid crystal display (LCD) device, not a self-emitting type of display, wherein the first electrode layer 31 is used as a common electrode, and the second electrode layer 33 is used as a pixel electrode. In another embodiment of the present disclosure, the first electrode layer 31 can be used as a pixel electrode and the second electrode layer 33 can be used as a common electrode if the first electrode layer 31 is electrically connected to the driving element TFT. In the present embodiment, the first electrode layer 31 comprises a third pinhole 311, and the first pinhole 163, the second pinhole 185 and the third pinhole 211 are vertically aligned to form a light path. The first pinhole 163, the second pinhole 185, and the third pinhole 211 are overlapped in a normal direction of the display device. In another embodiment of the present disclosure, the first electrode layer 31 does not comprise the third pinhole since the first electrode layer 31 is a transparent electrode that the light is capable of passing through.

Embodiment 5

Figure 6:
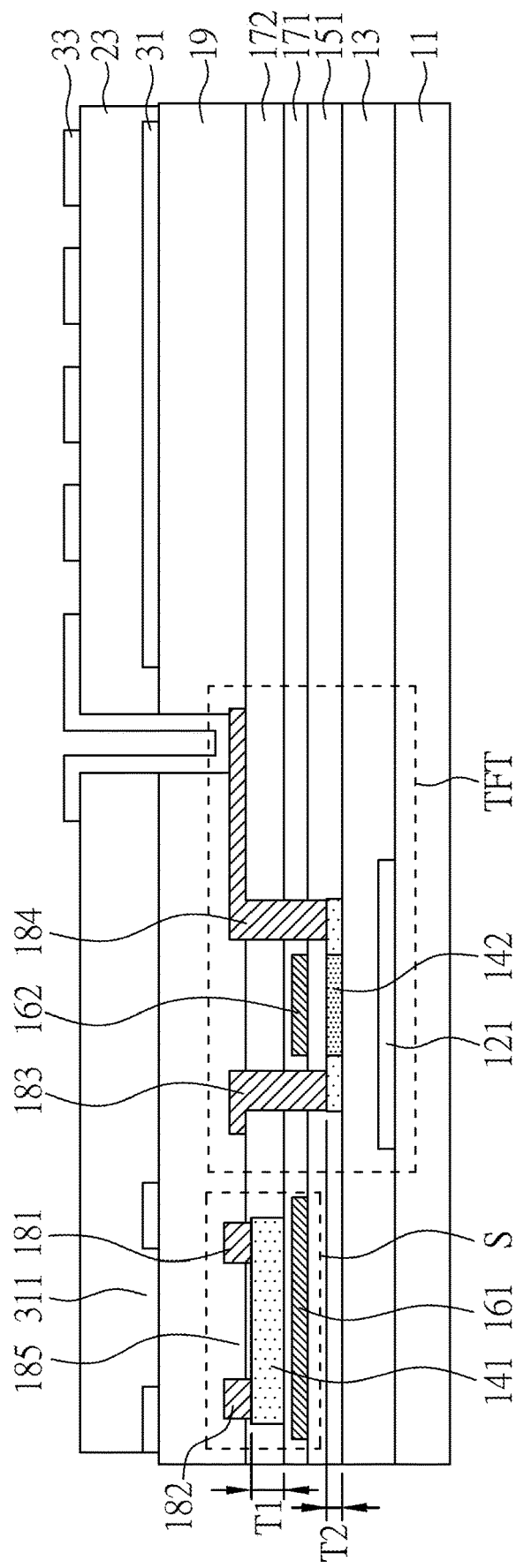
FIG. 6 is a cross sectional view of a display device according to Embodiment 5 of the present disclosure.

FIG. 6 is a cross sectional view of a display device of the present embodiment. The display device of the present embodiment is similar to that of Embodiment 4, except for the following.

In the present embodiment, the first metal layer comprises a first gate electrode 161 and and a second gate electrode 162, and the first insulating layer 171 is disposed on the first metal layer. A first semiconductor portion 141 is disposed on the first insulating layer 171 and corresponds to the first gate electrode 161. A second insulating layer 172 is formed on the first semiconductor portion 141. The material for the second insulating layer 172 is similar to that for the first insulating layer 171, and is not repeated again. The second metal layer is disposed on the second insulating layer 172 and comprises a first source electrode 181, a first drain electrode 182, a second source electrode 183 and a second drain electrode 184.

Hence, the display device of the present embodiment comprises: a substrate 11; a second metal layer (comprising the first source electrode 181 and the first drain electrode 182) disposed on the substrate 11 and having a second pinhole 185; a pixel electrode layer 31, disposed on the second metal layer; and a light detecting element S for detecting a light passing through the second pinhole 185. Herein, the light detecting element S comprises: the first gate electrode 161; the first semiconductor portion 141 corresponding to the first gate electrode 161; and the first source electrode 181 and the first drain electrode 182 electrically connects to the first semiconductor portion 141. In addition, the second pinhole 185 is a space between the first source electrode 181 and the first drain electrode 182.

Furthermore, in the present embodiment, the display device further comprises: a driving element TFT electrically connected to the pixel electrode layer 31, wherein the light detecting element S comprises a first semiconductor portion 141, the driving element TFT comprises a second semiconductor portion 142, and a thickness Ti of the first semiconductor portion 141 and a thickness T2 of the second semiconductor portion 142 are different. In the present embodiment, the thickness T1 of the first semiconductor portion 141 is greater than the thickness T2 of the second semiconductor portion 142. In the present embodiment, the first semiconductor portion 141 may comprise amorphous silicon, and the second semiconductor portion 142 may comprise poly-silicon. When the thickness Ti of the first semiconductor portion 141 is increased, the sensing resolution of the light detecting element S or the intensity of the photo signal received by the light detecting element S can be improved. In one embodiment of the present disclosure, the thickness Ti of the first semiconductor portion 141 can be ranged from 500 nm to 800 nm.

Embodiment 6

Figure 7:
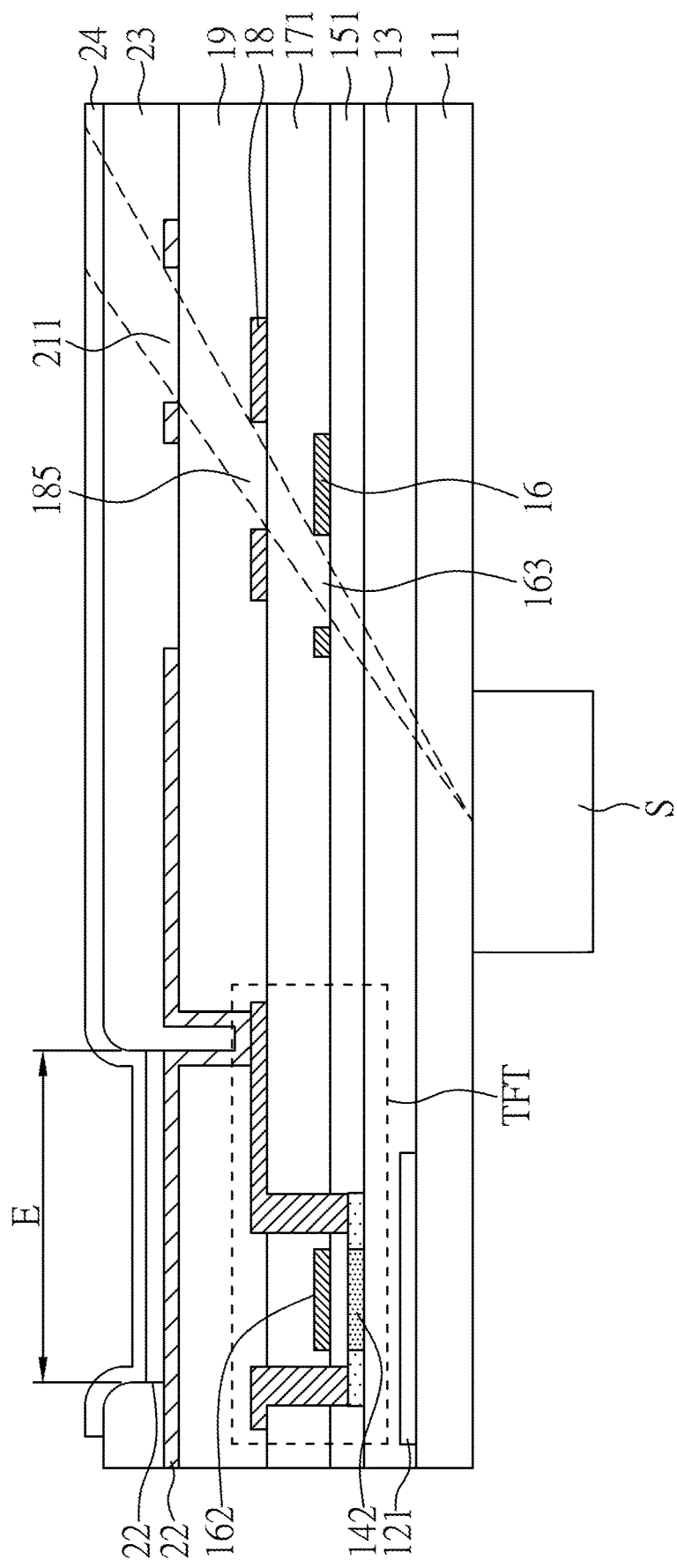
FIG. 7 is a cross sectional view of a display device according to Embodiment 6 of the present disclosure.

FIG. 7 is a cross sectional view of a display device of the present embodiment. The display device of the present embodiment is similar to that of Embodiment 1, except that the light detecting element S is disposed under the substrate 11 (on the backside of the substrate 11) which means the light detecting element S is disposed on a side of the substrate 11 opposite to another side of the substrate 11 where the first meta layer 16 is formed thereon, and the display device does not comprise the reflective layer 122 (as shown in FIG. 1) in the present embodiment. In the present embodiment, the light detecting element S is illustrated as one light detecting unit being disposed in (or corresponding to) one subpixel area, but this embodiment is not limited thereto. In other embodiment, one light detecting unit could be disposed in (or corresponding to) a plurality of subpixel areas.

Embodiment 7

Figure 8:
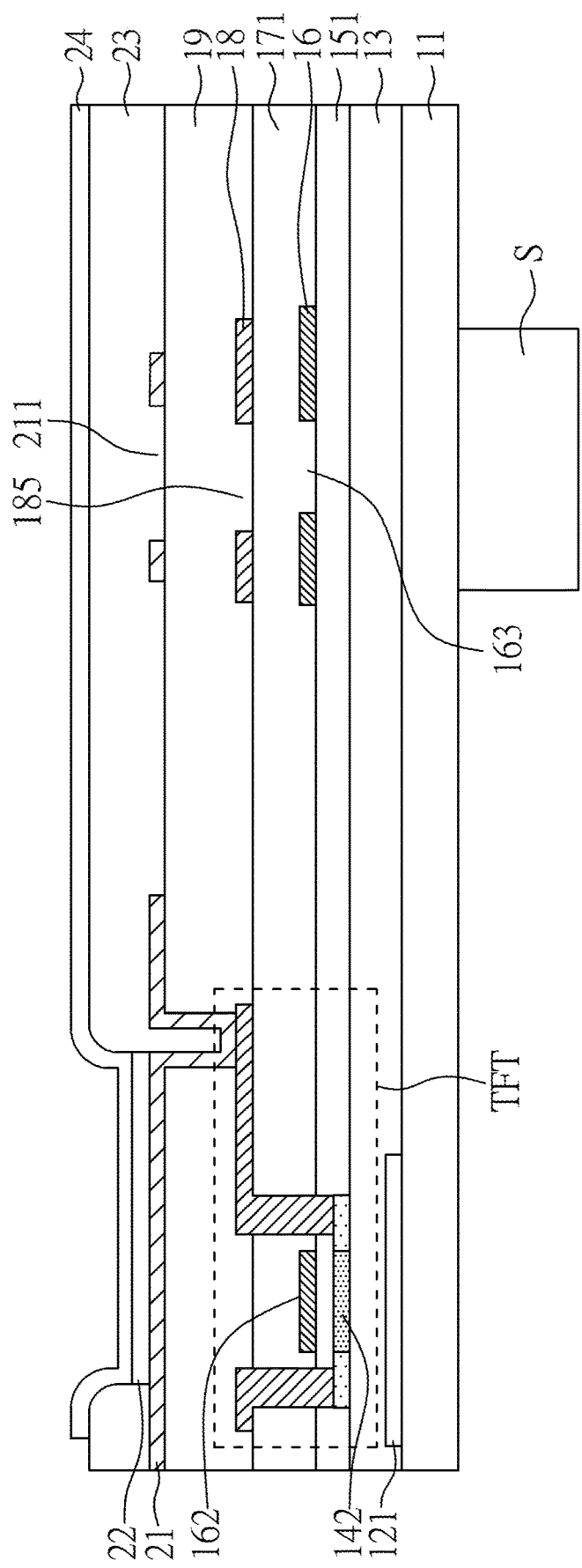
FIG. 8 is a cross sectional view of a display device according to Embodiment 7 of the present disclosure.

FIG. 8 is a cross sectional view of a display device of the present embodiment. The display device of the present embodiment is similar to that of Embodiment 6, except for the following.

In Embodiment 6, the light is laterally injected into the display device to the light detecting element S disposed under the substrate 11. In the present embodiment, the first pinhole 163, the second pinhole 185 and the third pinhole 211 overlap the light detecting element S in a normal direction of the display device, so the light injects into the display device in a normal direction of the display device to the light detecting element S disposed under the substrate 11.

Embodiment 8

Figure 9:
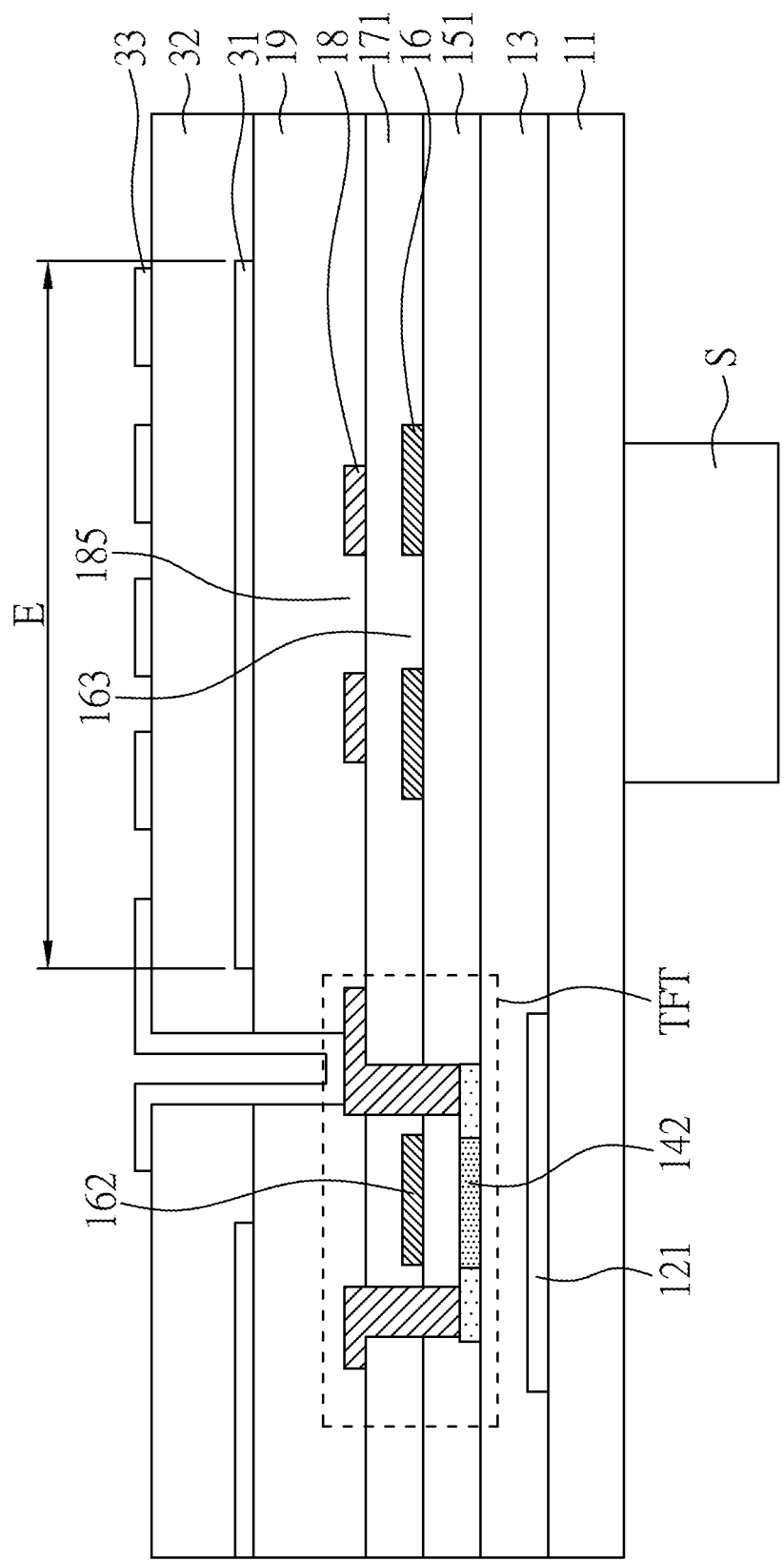
FIG. 9 is a cross sectional view of a display device according to Embodiment 8 of the present disclosure.

FIG. 9 is a cross sectional view of a display device of the present embodiment. The display device of the present embodiment is similar to that of Embodiment 4, except for the following.

In the present embodiment, the first metal layer 16 comprises a first pinhole 163, and the second metal layer 18 comprises a second pinhole 185. In addition, the light detecting element S is disposed under the substrate 11 (on the backside of the substrate 11) in the present embodiment.

In the present embodiment, the light detecting element S, the first pinhole 163 and the second pinhole 185 should be as better as disposed outside of the light emitting region E for keeping the transparency.

Embodiment 9

Figure 10:
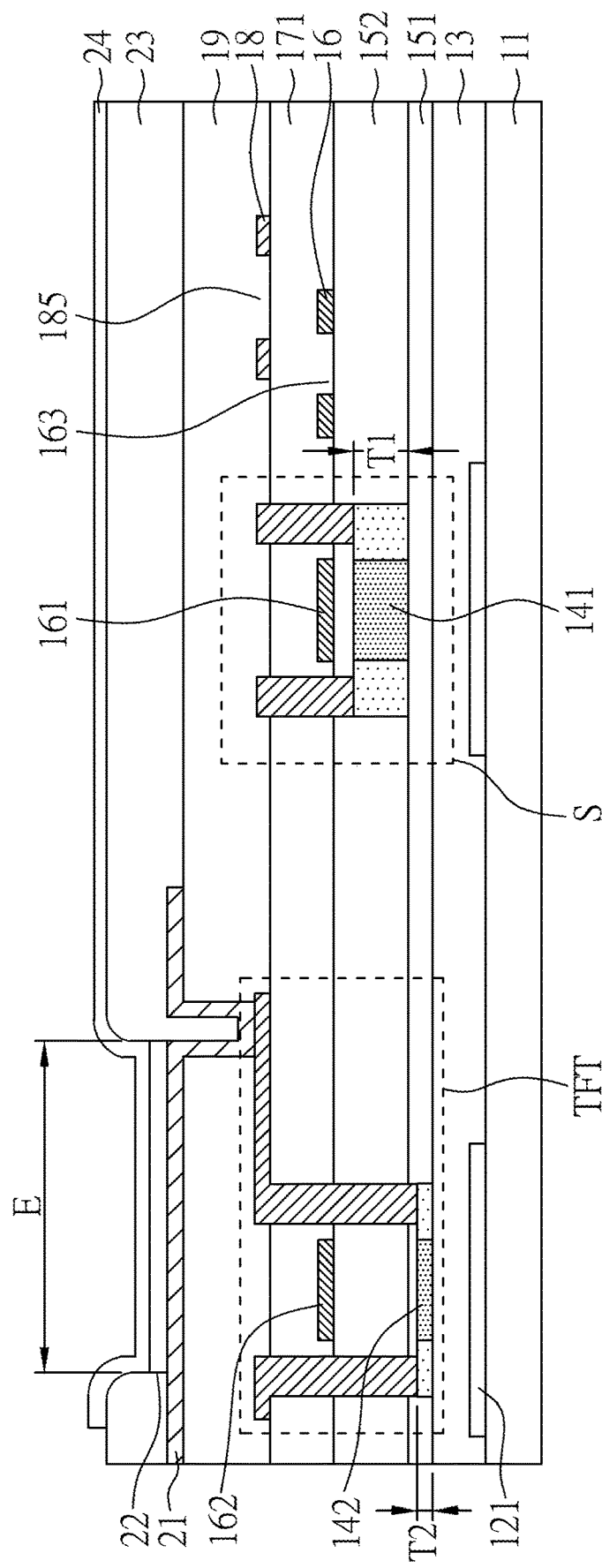
FIG. 10 is a cross sectional view of a display device according to Embodiment 9 of the present disclosure.

FIG. 10 is a cross sectional view of a display device of the present embodiment. The display device of the present embodiment is similar to that of Embodiment 1, except for the following.

In the present embodiment, the first semiconductor portion 141 and the second semiconductor portion 142 are formed at different steps. After the second semiconductor portion 142 is disposed on the buffer layer 13, the first gate insulating layer 151 is formed on the second semiconductor portion 142. Then, the first semiconductor portion 141 is formed on the first gate insulating layer 151, and another second gate insulating layer 152 is formed on the first semiconductor portion 141. The material for the second gate insulating layer 152 is similar to that of first gate insulating layer 151, and is not repeated again.

In the present embodiment, a thickness T1 of the first semiconductor portion 141 and a thickness T2 of the second semiconductor portion 142 are different. Especially, the thickness T1 of the first semiconductor portion 141 is greater than the thickness T2 of the second semiconductor portion 142. When the thickness T1 of the first semiconductor portion 141 is increased, the sensing resolution of the light detecting element S or the intensity of the photo signal received by the light detecting element S can be improved.

In the foregoing embodiments, the first semiconductor portion 141 may comprise a silicon-based material, and the crystallinity (crystallization ratio) of the silicon-based material ranged from amorphous silicon to poly-silicon, according to the desired detecting wavelength of the light detecting element S. The second semiconductor portion 142 may comprise silicon-based material with higher crystallinity (crystallization ratio) than the first semiconductor portion 141. In the present embodiment, the first semiconductor portion 141 may comprise amorphous silicon, and the second semiconductor portion 142 may comprise poly-silicon, but the present disclosure is not limited thereto. In other embodiment, both the first semiconductor portion 141 and the second semiconductor portion 142 may comprise poly-silicon with different crystallinity.

In the aforesaid embodiments, the OLED display device and the LCD device are illustrated. However, the present disclosure is not limited thereto. The display medium used in the display device can be quantum dots (QDs), fluorescence molecules, phosphors, normal inorganic light-emitting diodes (normal LEDs, in which the size of the chip contained therein is ranged from 300 μm to 10 mm), mini inorganic light-emitting diodes (mini LEDs, in which the size of the chip contained therein is ranged from 100 μm to 300 μm), micro inorganic light-emitting diodes (micro LEDs, in which the size of the chip contained therein is ranged from 1 μm to 100 μm), or other display medium.

Furthermore, the display device made as described in any of the embodiments of the present disclosure as described previously can be co-used with a touch panel to form a touch display device. Meanwhile, a display device or touch display device may be applied to any electronic devices known in the art that need a display screen, such as displays, mobile phones, laptops, video cameras, still cameras, music players, mobile navigators, TV sets, and other electronic devices that display images.

Although the present disclosure has been explained in relation to its embodiment, it is to be understood that many other possible modifications and variations can be made without departing from the spirit and scope of the disclosure as hereinafter claimed.

What is claimed is:

1. A display device, comprising:
a substrate;
a first metal layer, disposed on the substrate and having a first pinhole;
a second metal layer, disposed on the first metal layer and having a second pinhole;
a pixel electrode layer, disposed on the second metal layer; and
a light detecting element for detecting a light passing through the second pinhole and the first pinhole;
wherein a first edge of the first pinhole has a first slope, and a second edge of the second pinhole has a second slope, and the first slope and the second slope are different.

2. The display device of claim 1, wherein the pixel electrode layer has a third pinhole, and the light detecting element detects the light passing through the third pinhole, the second pinhole and the first pinhole.

3. The display device of claim 2, wherein the pixel electrode layer comprises at least one of Ag, Al, Al, Ti, Cr, and Mo.

4. The display device of claim 1, wherein the first metal layer comprises a first gate electrode, the second metal layer comprises a first source electrode and a first drain electrode, and the light detecting element comprises the first gate electrode, the first source electrode and the first drain electrode.

5. The display device of claim 1, wherein the first metal layer comprises a first source electrode and a first drain electrode, the light detecting element comprises the first source electrode and the first drain electrode, and the first pinhole is formed between the first source electrode and the first drain electrode.

6. The display device of claim 1, further comprising a reflective layer disposed between the substrate and the light detecting element, wherein the light passes through the second pinhole and the first pinhole to the reflective layer, and the reflective layer reflects the light to the light detecting element.

7. The display device of claim 1, wherein the first pinhole has a first width, the second pinhole has a second width, and the first width and the second width are different.

8. The display device of claim 1, wherein the light detecting element is disposed on a side of the substrate opposite to another side of the substrate where the first meta layer is formed thereon.

9. The display device of claim 1, further comprising a driving element electrically connected to the pixel electrode layer, wherein the light detecting element comprises a first semiconductor portion, the driving element comprises a second semiconductor portion, and a thickness of the first semiconductor portion and a thickness of the second semiconductor portion are different.

10. The display device of claim 9, wherein the thickness of the first semiconductor portion is greater than the thickness of the second semiconductor portion.

11. The display device of claim 9, wherein the thickness of the first semiconductor portion is ranged from 500 nm to 800 nm.

12. The display device of claim 9, wherein the first semiconductor portion comprises amorphous silicon or poly-silicon.

13. A display device, comprising:
a substrate;
a second metal layer, disposed on substrate and having a second pinhole;
a pixel electrode layer, disposed on the second metal layer and having a third pinhole; and
a light detecting element for detecting a light passing through the second pinhole and the third pinhole;
wherein an overlapped area of the second pinhole and the third pinhole at least partially overlaps the light detecting element in a normal direction of the display device.

14. The display device of claim 13, wherein the pixel electrode layer comprises at least one of Ag, Al, Al, Ti, Cr, and Mo.

15. The display device of claim 13, further comprising a driving element electrically connected to the pixel electrode layer, wherein the light detecting element comprises a first semiconductor portion, the driving element comprises a second semiconductor portion, and a thickness of the first semiconductor portion and a thickness of the second semiconductor portion are different.

16. The display device of claim 15, wherein the thickness of the first semiconductor portion is greater than the thickness of the second semiconductor portion.

17. The display device of claim 15, wherein the first semiconductor portion comprises amorphous silicon or poly-silicon.

18. The display device of claim 13, wherein the second metal layer comprises a first source electrode and a first drain electrode, the light detecting element comprises the first source electrode and the first drain electrode, and the second pinhole is formed between the first source electrode and the first drain electrode.

* * * * *